(12) United States Patent
Xi (10) Patent No.: US 11,380,277 B2
(45) Date of Patent: Jul. 5, 2022

(54) GOA CIRCUIT AND DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventor: Suping Xi, Guangdong (CN)

(73) Assignee: SHENZHEN CHINA STAR OPTOELECTRONICS SEMICONDUCTOR DISPLAY TECHNOLOGY CO., LTD, Guangdong (CN)

(*) Notice: Subject to any disclaimer, the term of this patent is extended or adjusted under 35 U.S.C. 154(b) by 328 days.

(21) Appl. No.: 16/645,474

(22) PCT Filed: Feb. 19, 2020

(86) PCT No.: PCT/CN2020/075860
§ 371 (c)(1),
(2) Date: Mar. 8, 2020

(87) PCT Pub. No.: WO2021/128547
PCT Pub. Date: Jul. 1, 2021

(65) Prior Publication Data
US 2021/0407450 A1 Dec. 30, 2021

(30) Foreign Application Priority Data

Dec. 24, 2019 (CN) .......................... 201911347598.0

(51) Int. Cl.
*G09G 3/36* (2006.01)

(52) U.S. Cl.
CPC ..... *G09G 3/3674* (2013.01); *G09G 2300/0408* (2013.01); *G09G 2310/0286* (2013.01)

(58) Field of Classification Search
CPC ..... G09G 3/3266; G09G 3/3674–3681; G09G 2310/0286
See application file for complete search history.

(56) References Cited

U.S. PATENT DOCUMENTS

| 8,537,094 | B2 * | 9/2013 | Yang | G11C 19/28 345/100 |
| 8,633,888 | B2 * | 1/2014 | Kim | G11C 19/28 345/100 |
| 9,454,940 | B1 * | 9/2016 | Dai | G09G 3/3674 |
| 9,484,111 | B2 * | 11/2016 | Xiao | G11C 19/00 |
| 9,552,790 | B2 * | 1/2017 | Dai | G09G 3/3677 |
| 9,576,678 | B2 * | 2/2017 | Lin | G11C 19/28 |
| 9,595,235 | B2 * | 3/2017 | Xiao | G09G 3/3677 |

(Continued)

FOREIGN PATENT DOCUMENTS

| CN | 104392700 A | 3/2015 |
| CN | 104537991 A | 4/2015 |

(Continued)

*Primary Examiner* — Patrick F Marinelli
(74) *Attorney, Agent, or Firm* — Soroker Agmon Nordman (57) ABSTRACT

A gate driver on array (GOA) circuit and a display panel are provided. The GOA circuit includes a plurality of cascaded GOA units. Switching transistor devices are added to an inverter of the GOA unit, and a low-potential signal is output to relevant nodes in the inverter in time to release residual charge of the relevant nodes.

18 Claims, 2 Drawing Sheets

(56) References Cited

U.S. PATENT DOCUMENTS

| | | | |
|---|---|---|---|
| 9,767,751 B2* | 9/2017 | Dai | G09G 3/3677 |
| 9,767,755 B2* | 9/2017 | Dai | G11C 19/28 |
| 9,858,880 B2* | 1/2018 | Dai | G09G 3/3677 |
| 10,283,068 B1* | 5/2019 | Lv | G09G 3/3677 |
| 10,339,871 B2* | 7/2019 | Zeng | G09G 3/20 |
| 10,438,676 B2* | 10/2019 | Zeng | G09G 3/3677 |
| 10,825,412 B2* | 11/2020 | Chen | G09G 3/3677 |
| 10,984,696 B1* | 4/2021 | Xi | H03K 19/01735 |
| 11,074,884 B1* | 7/2021 | Wang | G11C 19/28 |
| 11,151,959 B2* | 10/2021 | Xi | G09G 3/3677 |
| 11,158,274 B1* | 10/2021 | Xi | G09G 3/3674 |
| 2010/0214279 A1 | 8/2010 | Kim | G11C 19/28 345/213 |
| 2011/0234577 A1* | 9/2011 | Yang | G11C 19/28 345/212 |
| 2015/0255014 A1* | 9/2015 | Lin | G09G 5/003 345/84 |
| 2015/0268777 A1 | 9/2015 | Okamura | |
| 2015/0302813 A1 | 10/2015 | Yu | |
| 2015/0371599 A1* | 12/2015 | Xiao | G09G 3/36 345/212 |
| 2016/0140926 A1* | 5/2016 | Xiao | G09G 3/3677 345/215 |
| 2016/0140928 A1* | 5/2016 | Xiao | G09G 3/3648 345/212 |
| 2016/0189649 A1* | 6/2016 | Xiao | G09G 3/3677 345/214 |
| 2016/0275886 A1* | 9/2016 | Dai | G09G 3/3674 |
| 2016/0343331 A1* | 11/2016 | Dai | G09G 3/3677 |
| 2016/0351152 A1* | 12/2016 | Dai | H01L 29/7869 |
| 2017/0084240 A1* | 3/2017 | Dai | G11C 19/28 |
| 2017/0213512 A1* | 7/2017 | Dai | G09G 3/3677 |
| 2018/0268768 A1* | 9/2018 | Lv | G11C 19/28 |
| 2019/0103167 A1* | 4/2019 | Zeng | G09G 3/3677 |
| 2019/0139494 A1* | 5/2019 | Zeng | G09G 3/3677 |
| 2019/0139506 A1* | 5/2019 | Lv | G09G 3/3677 |
| 2020/0035180 A1* | 1/2020 | Chen | G09G 3/3677 |
| 2021/0256925 A1* | 8/2021 | Wang | G09G 3/3677 |
| 2021/0280147 A1* | 9/2021 | Xi | G09G 3/3677 |
| 2021/0335303 A1* | 10/2021 | Xi | G09G 3/3696 |

FOREIGN PATENT DOCUMENTS

| | | |
|---|---|---|
| CN | 104851403 A | 8/2015 |
| CN | 107863074 A | 3/2018 |
| CN | 109935191 A | 6/2019 |
| CN | 110570799 A | 12/2019 |
| WO | 2019001059 A1 | 1/2019 |

* cited by examiner

GOA CIRCUIT AND DISPLAY PANEL

FIELD OF INVENTION

The present disclosure relates to the field of display driving technologies, and more particularly to a gate driver on array (GOA) circuit and a display panel including the same.

BACKGROUND OF INVENTION

GOA circuit, that is, gate driver on array technology, is a gate driving circuit fabricated on a base substrate by using an existing array manufacturing process of a liquid crystal display panel to realize a driving method of line-by-line scanning of scan lines.

At present, GOA technology has been widely used in panel design. Therefore, it is especially necessary to continuously optimize the GOA circuit to make GOA circuit performance more stable. In existing designs, due to a design of an inverter, relevant nodes will have residual charge. This easily accelerates deterioration of a device, and then affects stability of the inverter, thereby destroying stability of the GOA circuit.

SUMMARY OF INVENTION

The present invention provides a gate driver on array (GOA) circuit and a display panel, which can timely release residual charge in an inverter, and prevent a transistor device in the inverter from being damaged due to residual charge, which further affects stability of the inverter.

The present invention provides a GOA circuit and a display panel, which can timely release residual charge in an inverter to solve issues of a current GOA circuit that relevant nodes in the inverter will have residual charge, which will damage a device, affect stability of the inverter, and then affect a display performance.

To solve the above issues, a technical solution provided by the present invention is as follows.

An embodiment of the present invention provides a GOA circuit, comprising: a plurality of cascaded GOA units, wherein a nth GOA unit comprises a pull-up control module, a pull-up module, a cascade module, a pull-down module, a pull-down maintenance module, and a bootstrap capacitor, and n is a positive integer; wherein the pull-down maintenance module is configured to maintain a potential of a current-stage control signal, and the pull-down maintenance module comprises a first inverter; wherein the first inverter comprises an eleventh switching transistor, a twelfth switching transistor, a thirteenth switching transistor, a fourteenth switching transistor, a fifteenth switching transistor, and a sixteenth switching transistor, a source and a gate of the eleventh switching transistor and a source of the thirteenth switching transistor are all connected to a first potential signal, a drain of the eleventh switching transistor, a drain of the twelfth switching transistor, a gate of the thirteenth switching transistor, and a drain of the sixteenth switching transistor are all connected to a first node, a drain of the thirteenth switching transistor, a drain of the fourteenth switching transistor, and a drain of the fifteenth switching transistor are all connected to a second node, and a gate of the twelfth switching transistor and a gate of the fourteenth switching transistor are both connected to the current-stage control signal, a source of the twelfth switching transistor, a source of the fourteenth switching transistor, a source of the fifteenth switching transistor, and a source of the sixteenth switching transistor are all connected to a low-potential signal, and a gate of the fifteenth switching transistor and a gate of the sixteenth switching transistor are both connected to a second potential signal; wherein a phase of the first potential signal and a phase of the second potential signal are opposite.

In an embodiment of the present invention, the pull-down maintenance module further comprises a second inverter, and the second inverter comprises a twenty-first switching transistor, a twenty-second switching transistor, a twenty-third switching transistor, a twenty-fourth switching transistor, a twenty-fifth switching transistor, and a twenty-sixth switching transistor; wherein a source and a gate of the twenty-first switching transistor and a source of the twenty-third switching transistor are all connected to the second potential signal, a drain of the twenty-first switching transistor, a drain of the twenty-second switching transistor, a gate of the twenty-third switching transistor, and a drain of the twenty-six switching transistor are all connected to a third node, and a drain of the twenty-third switching transistor, a drain of the twenty-fourth switching transistor, and a drain of the twenty-fifth switching transistor are all connected to a fourth node, a gate of the twenty-second switching transistor and a gate of the twenty-fourth switching transistor are both connected to the current-stage control signal, a source of the twenty-second switching transistor, a source of the twenty-fourth switching transistor, a source of the twenty-fifth switching transistor, and a source of the twenty-sixth switching transistor are all connected to the low-potential signal, and a gate of the twenty-fifth switching transistor and a gate of the twenty-sixth switching transistor are both connected to the first potential signal.

In an embodiment of the present invention, the pull-down maintenance module further comprises a seventeenth switching transistor and a twenty-seventh switching transistor; wherein a gate of the seventeenth switching transistor is connected to the second node, a source and a drain of the seventeenth switching transistor are connected to the low-potential signal and the current-stage control signal, respectively, a gate of the twenty-seventh switching transistor is connected to the fourth node, and a source and a drain of the twenty-seventh switching transistor are connected to the low-potential signal and the current-stage control signal, respectively.

In an embodiment of the present invention, the GOA unit further comprises a reset module configured to reset a potential of the current-stage control signal, the reset module comprises a reset switching transistor, a gate of the reset switching transistor is connected to a reset signal, a source of the reset switching transistor is connected to the low-potential signal, and a drain of the reset switching transistor is connected to the current-stage control signal.

In an embodiment of the present invention, the pull-up control module receives an n−4th stage transmission signal and outputs the current-stage control signal according to a control of an n−4th stage scanning signal.

In an embodiment of the present invention, the pull-up module is electrically connected to the pull-up control module, and the pull-up module receives a clock signal and outputs a current-stage scanning signal according to a control of the current-stage control signal.

In an embodiment of the present invention, an end of the bootstrap capacitor is connected to the current-stage control signal and another end thereof is connected to the current-stage scanning signal.

In an embodiment of the present invention, the cascade module comprises a thirty-first switching transistor, a source of the thirty-first switching transistor is connected to the clock signal, a gate of the thirty-first switching transistor is connected to the current-stage control signal, and a drain of the thirty-first switching transistor outputs a current-stage transmission signal.

In an embodiment of the present invention, the pull-down module receives the low-potential signal and pulls down the current-stage control signal and the current-stage scanning signal to a low potential according to a control of a n+4th stage scanning signal.

An object of an embodiment of the present invention provides a display panel, comprising: a gate driver on array (GOA) circuit comprising a plurality of cascaded GOA units, wherein a nth GOA unit comprises a pull-up control module, a pull-up module, a cascade module, a pull-down module, a pull-down maintenance module, and a bootstrap capacitor, and n is a positive integer; wherein the pull-down maintenance module is configured to maintain a potential of a current-stage control signal, and the pull-down maintenance module comprises a first inverter; wherein the first inverter comprises an eleventh switching transistor, a twelfth switching transistor, a thirteenth switching transistor, a fourteenth switching transistor, a fifteenth switching transistor, and a sixteenth switching transistor, a source and a gate of the eleventh switching transistor and a source of the thirteenth switching transistor are all connected to a first potential signal, a drain of the eleventh switching transistor, a drain of the twelfth switching transistor, a gate of the thirteenth switching transistor, and a drain of the sixteenth switching transistor are all connected to a first node, a drain of the thirteenth switching transistor, a drain of the fourteenth switching transistor, and a drain of the fifteenth switching transistor are all connected to a second node, and a gate of the twelfth switching transistor and a gate of the fourteenth switching transistor are both connected to the current-stage control signal, a source of the twelfth switching transistor, a source of the fourteenth switching transistor, a source of the fifteenth switching transistor, and a source of the sixteenth switching transistor are all connected to a low-potential signal, and a gate of the fifteenth switching transistor and a gate of the sixteenth switching transistor are both connected to a second potential signal; wherein a phase of the first potential signal and a phase of the second potential signal are opposite.

In an embodiment of the present invention, the pull-down maintenance module further comprises a second inverter, and the second inverter comprises a twenty-first switching transistor, a twenty-second switching transistor, a twenty-third switching transistor, a twenty-fourth switching transistor, a twenty-fifth switching transistor, and a twenty-sixth switching transistor; wherein a source and a gate of the twenty-first switching transistor and a source of the twenty-third switching transistor are all connected to the second potential signal, a drain of the twenty-first switching transistor, a drain of the twenty-second switching transistor, a gate of the twenty-third switching transistor, and a drain of the twenty-six switching transistor are all connected to a third node, and a drain of the twenty-third switching transistor, a drain of the twenty-fourth switching transistor, and a drain of the twenty-fifth switching transistor are all connected to a fourth node, a gate of the twenty-second switching transistor and a gate of the twenty-fourth switching transistor are both connected to the current-stage control signal, a source of the twenty-second switching transistor, a source of the twenty-fourth switching transistor, a source of the twenty-fifth switching transistor, and a source of the twenty-sixth switching transistor are all connected to the low-potential signal, and a gate of the twenty-fifth switching transistor and a gate of the twenty-sixth switching transistor are both connected to the first potential signal.

In an embodiment of the present invention, the pull-down maintenance module further comprises a seventeenth switching transistor and a twenty-seventh switching transistor; wherein a gate of the seventeenth switching transistor is connected to the second node, a source and a drain of the seventeenth switching transistor are connected to the low-potential signal and the current-stage control signal, respectively, a gate of the twenty-seventh switching transistor is connected to the fourth node, and a source and a drain of the twenty-seventh switching transistor are connected to the low-potential signal and the current-stage control signal, respectively.

In an embodiment of the present invention, the GOA unit further comprises a reset module configured to reset a potential of the current-stage control signal, the reset module comprises a reset switching transistor, a gate of the reset switching transistor is connected to a reset signal, a source of the reset switching transistor is connected to the low-potential signal, and a drain of the reset switching transistor is connected to the current-stage control signal.

In an embodiment of the present invention, the pull-up control module receives an n−4th stage transmission signal and outputs the current-stage control signal according to a control of an n−4th stage scanning signal.

In an embodiment of the present invention, the pull-up module is electrically connected to the pull-up control module, and the pull-up module receives a clock signal and outputs a current-stage scanning signal according to a control of the current-stage control signal.

In an embodiment of the present invention, an end of the bootstrap capacitor is connected to the current-stage control signal and another end thereof is connected to the current-stage scanning signal.

In an embodiment of the present invention, the cascade module comprises a thirty-first switching transistor, a source of the thirty-first switching transistor is connected to the clock signal, a gate of the thirty-first switching transistor is connected to the current-stage control signal, and a drain of the thirty-first switching transistor outputs a current-stage transmission signal.

In an embodiment of the present invention, the pull-down module receives the low-potential signal and pulls down the current-stage control signal and the current-stage scanning signal to a low potential according to a control of a n+4th stage scanning signal.

Beneficial effects of embodiments of the present invention are that, switching transistor devices are added to an inverter of the GOA unit, and a low-potential signal is output to relevant nodes in the inverter in time to release residual charge of the relevant nodes. This effectively reduces current stress on the switching transistor devices in the inverter, thereby increasing life of the switching transistor devices and increasing stability of the GOA circuit.

DESCRIPTION OF DRAWINGS

In order to explain technical solutions in embodiments or the prior art more clearly, drawings used in the description of the embodiments or the prior art will be briefly introduced below. Obviously, the drawings in the following description are only some embodiments of the present invention. For those of ordinary skill in the art, other drawings can be obtained based on these drawings without paying creative efforts.

DETAILED DESCRIPTION OF PREFERRED EMBODIMENTS

The technical solutions in the embodiments of the present invention will be clearly and completely described below with reference to the drawings in the embodiments of the present invention. Obviously, the described embodiments are only a part of the embodiments of the present invention, but not all the embodiments. Based on the embodiments of the present invention, all other embodiments obtained by those skilled in the art without creative efforts fall into the protection scope of the present invention.

In the description of the present invention, it should be understood that the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc. of orientation or positional relationship is based on the orientation or positional relationship shown in the drawings. This is only for the convenience of describing the present invention and simplifying the description, and does not indicate or imply that the device or element referred to must have a specific orientation, be constructed and operate in a specific orientation, and therefore cannot be understood as a limitation on the present invention. In addition, the terms "first" and "second" are used for descriptive purposes only and cannot be understood as indicating or implying relative importance or implicitly indicating the number of technical features indicated. Therefore, the features defined as "first" and "second" may explicitly or implicitly include one or more of the features. In the description of the present invention, the meaning of "plurality" is two or more, unless specifically defined otherwise.

In the description of the present invention, it should be noted that the terms "installation", "link", and "connection" should be understood in a broad sense unless otherwise specified and limited. For example, it can be a fixed connection, a detachable connection, or an integral connection. It can be a mechanical connection, an electrical connection or can communicate with each other. It can be directly connected or indirectly connected through an intermediate medium. It can be the internal connection of two elements or the interaction between two elements. For those of ordinary skill in the art, the specific meanings of the above terms in the present invention can be understood according to specific situations.

In the present invention, unless explicitly stated and defined otherwise, a first feature "above" or "below" a second feature may include direct contact between the first and second features, and may also include that the first and second features are not in direct contact but are contacted by another feature between them. Moreover, the first feature is "on", "over" and "above" the second feature including that the first feature is directly above and diagonally above the second feature, or it simply means that a level of the first feature is higher than that of the second feature. The first feature is "under", "beneath", and "below" the second feature, including that the first feature is directly below and obliquely below the second feature, or it simply means that a level of the first feature is lower than that of the second feature.

The following disclosure provides many different implementations or examples for implementing different structures of the present invention. To simplify the disclosure of the present invention, the components and settings of specific examples are described below. Of course, they are merely examples and are not intended to limit the present invention. In addition, the present invention may repeat reference numerals and/or reference letters in different examples. This repetition is for simplicity and clarity and does not by itself indicate the relationship between the various embodiments and/or settings discussed. In addition, the present invention provides examples of various specific processes and materials, but one of ordinary skill in the art may recognize applications of other processes and/or use of other materials.

In an existing GOA circuit and display panel, relevant nodes in an inverter will have residual charge, which will cause a device to accelerate aging, affect stability of the inverter, and then affect display performance. An embodiment of the present invention can solve this defect.

To solve the above technical problems, embodiments of the present invention provide a GOA circuit and a display panel having the GOA circuit.

Figure 1:
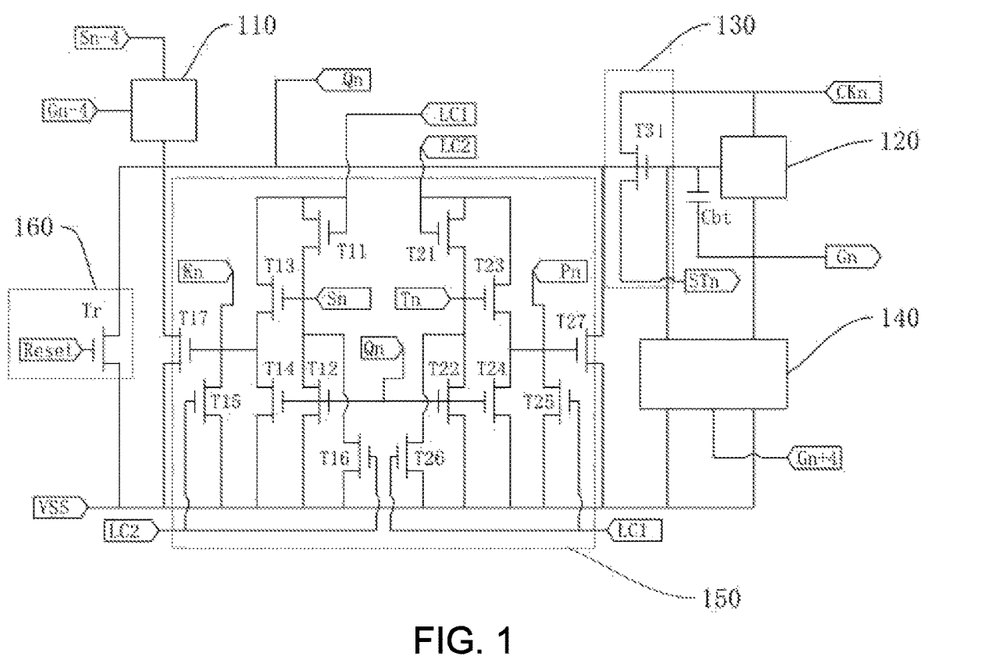
FIG. 1 is a circuit diagram of a GOA unit according to an embodiment of the present invention.

The GOA circuit comprises a plurality of cascaded GOA units, wherein a nth GOA unit as shown in FIG. 1 comprises a pull-up control module 110, a pull-up module 120, a cascade module 130, a pull-down module 140, a pull-down maintenance module 150, and a bootstrap capacitor Cbt, and n is a positive integer.

The pull-down maintenance module 150 is configured to maintain a potential of a current-stage control signal Qn, and the pull-down maintenance module 150 comprises a first inverter.

The first inverter comprises an eleventh switching transistor T11, a twelfth switching transistor T12, a thirteenth switching transistor T13, a fourteenth switching transistor T14, a fifteenth switching transistor T15, and a sixteenth switching transistor T16, a source and a gate of the eleventh switching transistor T11 and a source of the thirteenth switching transistor T13 are all connected to a first potential signal LC1, a drain of the eleventh switching transistor T11, a drain of the twelfth switching transistor T12, a gate of the thirteenth switching transistor T13, and a drain of the sixteenth switching transistor T16 are all connected to a first node Sn, a drain of the thirteenth switching transistor T13, a drain of the fourteenth switching transistor T14, and a drain of the fifteenth switching transistor T15 are all connected to a second node Kn, and a gate of the twelfth switching transistor T12 and a gate of the fourteenth switching transistor T14 are both connected to the current-stage control signal Qn, a source of the twelfth switching transistor T12, a source of the fourteenth switching transistor T14, a source of the fifteenth switching transistor T15, and a source of the sixteenth switching transistor T16 are all connected to a low-potential signal VSS, and a gate of the fifteenth switching transistor T15 and a gate of the sixteenth switching transistor T16 are both connected to a second potential signal LC2.

A phase of the first potential signal LC1 and a phase of the second potential signal LC2 are opposite.

In tan embodiment of an application process, charges will remain at relevant nodes of the inverter of the GOA circuit, easily accelerated deterioration of a device, and thus affect stability of the inverter, thereby undermining stability of the GOA circuit. The GOA circuit provided in this embodiment is respectively connected to the second node Kn and the first node Sn by newly adding the fifteenth switching transistor T15 and the sixteenth switching transistor T16. When the first inverter is not working, the first node Sn and the second node Kn are pulled down to a low potential, and this releases the charge remaining in both nodes in time. This effectively reduces current stress on the devices in the inverter, thereby increasing life of the device and increasing stability of the GOA circuit.

It should be noted that switching transistors mentioned in the embodiments of the present invention may all be thin film electric transistor devices, and the types of the thin film electric transistor devices are not limited herein.

In details, as shown in FIG. 1, the pull-down maintenance module 150 further comprises a second inverter, and the second inverter comprises a twenty-first switching transistor T21, a twenty-second switching transistor T22, a twenty-third switching transistor T23, a twenty-fourth switching transistor T24, a twenty-fifth switching transistor T25, and a twenty-sixth switching transistor T26.

A source and a gate of the twenty-first switching transistor T21 and a source of the twenty-third switching transistor T23 are all connected to the second potential signal LC2, a drain of the twenty-first switching transistor T21, a drain of the twenty-second switching transistor T22, a gate of the twenty-third switching transistor T23, and a drain of the twenty-six switching transistor T26 are all connected to a third node Tn, and a drain of the twenty-third switching transistor T23, a drain of the twenty-fourth switching transistor T24, and a drain of the twenty-fifth switching transistor T25 are all connected to a fourth node Pn, a gate of the twenty-second switching transistor T22 and a gate of the twenty-fourth switching transistor T24 are both connected to the current-stage control signal Qn, a source of the twenty-second switching transistor T22, a source of the twenty-fourth switching transistor T24, a source of the twenty-fifth switching transistor T25, and a source of the twenty-sixth switching transistor T26 are all connected to the low-potential signal VSS, and a gate of the twenty-fifth switching transistor T25 and a gate of the twenty-sixth switching transistor T26 are both connected to the first potential signal LC1.

A phase of the first potential signal LC1 and a phase of the second potential signal LC2 are opposite.

In details, the pull-down maintenance module 150 further comprises a seventeenth switching transistor T17 and a twenty-seventh switching transistor T27. A gate of the seventeenth switching transistor T17 is connected to the second node Kn, a source and a drain of the seventeenth switching transistor T17 are connected to the low-potential signal VSS and the current-stage control signal Qn, respectively, a gate of the twenty-seventh switching transistor T27 is connected to the fourth node Pn, and a source and a drain of the twenty-seventh switching transistor T27 are connected to the low-potential signal VSS and the current-stage control signal Qn, respectively.

In addition, in an embodiment of the present invention, as shown in FIG. 1, the nth GOA unit further includes a pull-up control module 110, a pull-up module 120, a cascade module 130, a pull-down module 140, and a bootstrap capacitor Cbt.

In an embodiment of the present invention, the pull-up control module 110 receives an n−4th stage transmission signal and outputs the current-stage control signal Qn according to a control of an n−4th stage scanning signal Gn−4.

The pull-up module 120 is electrically connected to the pull-up control module 110, that is, one end of the pull-up module 120 receives the current-stage control signal Qn output from the pull-up control module 110, and another end of the pull-up module 110 receives a clock signal CKn, and outputs a current-stage scanning signal Gn according to a control of the current-stage control signal Qn.

An end of the bootstrap capacitor Cbt is connected to the current-stage control signal Qn, and another end thereof is connected to the current-stage scanning signal Gn.

The pull-up module 120 is electrically connected to the pull-up control module 110, and the pull-up module 120 receives a clock signal and outputs a current-stage scanning signal according to a control of the current-stage control signal.

The cascade module 130 comprises a thirty-first switching transistor T31, a source of the thirty-first switching transistor T31 is connected to the clock signal CKn, a gate of the thirty-first switching transistor T31 is connected to the current-stage control signal Qn, and a drain of the thirty-first switching transistor T31 outputs a current-stage transmission signal STn.

An end of the pull-down module 140 receives the low-potential signal VSS, and another end thereof receives the n+4 stage scanning signal Gn+4, and outputs the low-potential signal VSS to the current-stage control signal Qn and the current-stage scanning signal Gn according to the control of the n+4th stage scanning signal Gn+4, that is, the current-stage control signal Qn and the current-stage scanning signal Gn are pulled down to a low potential.

The GOA unit further comprises a reset module 160 configured to reset a potential of the current-stage control signal Qn, the reset module 160 comprises a reset switching transistor Tr, a gate of the reset switching transistor Tr is connected to a reset signal Reset, a source of the reset switching transistor Tr is connected to the low-potential signal VSS, and a drain of the reset switching transistor Tr is connected to the current-stage control signal Qn.

The operation principle of the nth GOA unit in this embodiment is described below.

The pull-up module 110 outputs the n−4th stage transmission signal Sn−4 to the current-stage control signal Qn according to the control of the n−4th stage scanning signal Gn−4, and pulls up the current-stage control signal Qn to a high potential.

The thirty-first switch T31 and a control terminal of the pull-up module 120 receive the current-stage control signal Qn, and output the clock signal CKn to the current-stage transmission signal STn and the current-stage scanning signal Gn.

Two ends of the bootstrap capacitor Cbt are respectively connected to the current-stage control signal Qn and the current-stage scanning signal Gn, so that the current-stage control signal Qn reaches a higher potential.

A control terminal of the pull-down module 140 receives the n+4th stage scanning signal Gn+4, and outputs the low-potential signal VSS to the current-stage control signal Qn and the current-stage scanning signal Gn. That is, the current-stage control signal Qn and the current-stage scanning signal Gn are both pulled down to a low potential.

The pull-down maintenance module 150 includes the first inverter and the second inverter. When the first inverter operates, the first potential signal LC1 is at a high potential, and the second potential signal LC2 is at a low potential. The fifteenth switching transistor T15 and the sixteenth switching transistor T16 are both in an off state. If the first potential signal LC1 is at a high potential, the eleventh switching transistor T11 is turned on and outputs a high potential, and then the first node Sn is at a high potential. When the thirteenth switching transistor T13 is turned on, the thirteenth switching transistor T13 outputs a high potential, so that the second node Kn is at a high potential. The gate of the seventeenth switching transistor T17 is connected to the second node Kn, the seventeenth switching transistor T17 is turned on, and the low-potential signal VSS is output to the current-stage control signal Qn, so that the current-stage control signal Qn is maintained at a low potential.

When the first inverter does not operate, the first potential signal LC1 is at a low potential, and the second potential signal LC2 is at a high potential. The fifteenth switching transistor T15 and the sixteenth switching transistor T16 are both in an on state. When the current-stage control signal Qn is at a low potential, the eleventh switching transistor T11, the twelfth switching transistor T12, the thirteenth switching transistor T13, and the fourteenth switching transistor T14 are all in an off state. The sixteenth switching transistor T16 and the fifteenth switching transistor T15 output the low-potential signal VSS to the first node Sn and the second node Kn. The first node Sn and the second node Kn are pulled down to a low potential. That is, releasing residual charges at the first node Sn and the second node Kn can effectively prevent residual charges from causing damage to transistor devices in the first inverter.

When the current-stage control signal Qn is at a high potential, the first potential signal LC1 is at a low potential, and the second potential signal LC2 is at a high potential, then the eleventh switching transistor T11 and the thirteenth switching transistor T13 are both in an off state. The twelfth switching transistor T12 and the fourteenth switching transistor T14 are in an on state. The twelfth switching transistor T12 and the fourteenth switching transistor T14 respectively output the low-potential signal VSS to the first node Sn and the second node Kn. The sixteenth switching transistor T16 and the fifteenth switching transistor T15 are both in an on state. This can pull down the first node Sn and the second node Kn to a low potential in advance, and also effectively reduce leakage of the current-stage control signal Qn.

In an embodiment of the present invention, because the phase of the first potential signal LC1 and the phase of the second potential signal LC2 are opposite, the first inverter and the second inverter work alternately. When the first inverter is not operated, that is, the first potential signal LC1 is at a low potential, then the second potential signal LC2 is at a high potential, that is, the second inverter is operating. At this time, the twenty-fifth switching transistor T25 and the twenty-sixth switching transistor T26 are both in an off state. If the second potential signal LC2 is high, the twenty-first switching transistor T21 is turned on and outputs a high potential, and the third node Tn is high. When the twenty-third switching transistor T23 is turned on, the twenty-third switching transistor T23 outputs a high potential, so that the fourth node Pn is at a high potential. The gate of the twenty-seventh switching transistor T27 is connected to the fourth node Pn. The twenty-seventh switching transistor T27 is turned on, and outputs the low-potential signal VSS to the current-stage control signal Qn to maintain the current-stage control signal Qn at a low level.

When the first inverter is operated, that is, when the second inverter is not operated, the first potential signal LC1 is at a high potential, the second potential signal LC2 is at a low potential, and the twenty-five switching transistor T25 and the twenty-sixth switching transistor T26 are both in an on state. When the current-stage control signal Qn is at a low potential, the twenty-first switching transistor T21, the twenty-second switching transistor T22, the twenty-third switching transistor T23, and the twenty-fourth switching transistor T24 are all in an off state. The twenty-sixth switching transistor T26 and the twenty-fifth switching transistor T25 output the low-potential signal VSS to the third node Tn and the fourth node Pn. The third node Tn and the fourth node Pn are pulled down to a low potential. That is, charges remaining at the third node Tn and the fourth node Pn are discharged. This can effectively prevent residual charge from causing damage to transistor devices in the second inverter.

When the current-stage control signal Qn is at a high potential, the first potential signal LC1 is at a high potential, the second potential signal LC2 is at a low potential, the twenty-first switching transistor T21 and the twenty-third switching transistor T23 are both in an off state. The twenty-second switching transistor T22 and the twenty-fourth switching transistor T24 are in an on state. The twenty-second switching transistor T22 and the twenty-fourth switching transistor T24 respectively output the low-potential signal VSS to the third node Tn and the fourth node Pn. At this time, the twenty-sixth switching transistor T26 and the twenty-fifth switching transistor T25 are both in an on state. This can pull down the third node Tn and the fourth node Pn to a low potential in advance, and also effectively reduce leakage of the current-stage control signal Qn.

In addition, in this embodiment, the nth GOA unit further includes a reset module 160 for resetting the potential of the current-stage control signal Qn in the nth GOA unit. When the reset switching transistor Tr receives the reset signal Reset, the low-potential signal VSS is output to the current-stage control signal Qn, and the current-stage control signal Qn is pulled down to a low potential.

In summary, when the first potential signal LC1 is at a low potential, the eleventh switching transistor T11 and the thirteenth switching transistor T13 are in an off state for a long time, and it is easy to retain electric charges. At this time, the fifteenth switching transistor T15 and the sixteenth switching transistor T16 are turned on, and charges can be discharged. This can effectively reduce current stress that the first inverter receives during operation and increase life of the first inverter. When the first potential signal LC1 is at a high potential, the second potential signal LC2 is at a low potential, and the fifteenth switching transistor T15 and the sixteenth switching transistor T16 are in an off state, which does not affect operation of the first inverter.

Similarly, when the second potential signal LC2 is at a low potential, the twenty-first switching transistor T21 and the twenty-third switching transistor T23 are in an off state for a long time, and it is easy to retain electric charges. At this time, the twenty-fifth switching transistor T25 and the twenty-sixth switching transistor T26 are turned on, and charges can be discharged. This can effectively reduce current stress that the second inverter receives during operation and increase life of the second inverter. When the first potential signal LC1 is at a low potential and the second potential signal LC2 is at a high potential, the twenty-fifth switching transistor T25 and the twenty-sixth switching transistor T26 are in an off state, and will not affect operation of the second inverter.

Figure 2:
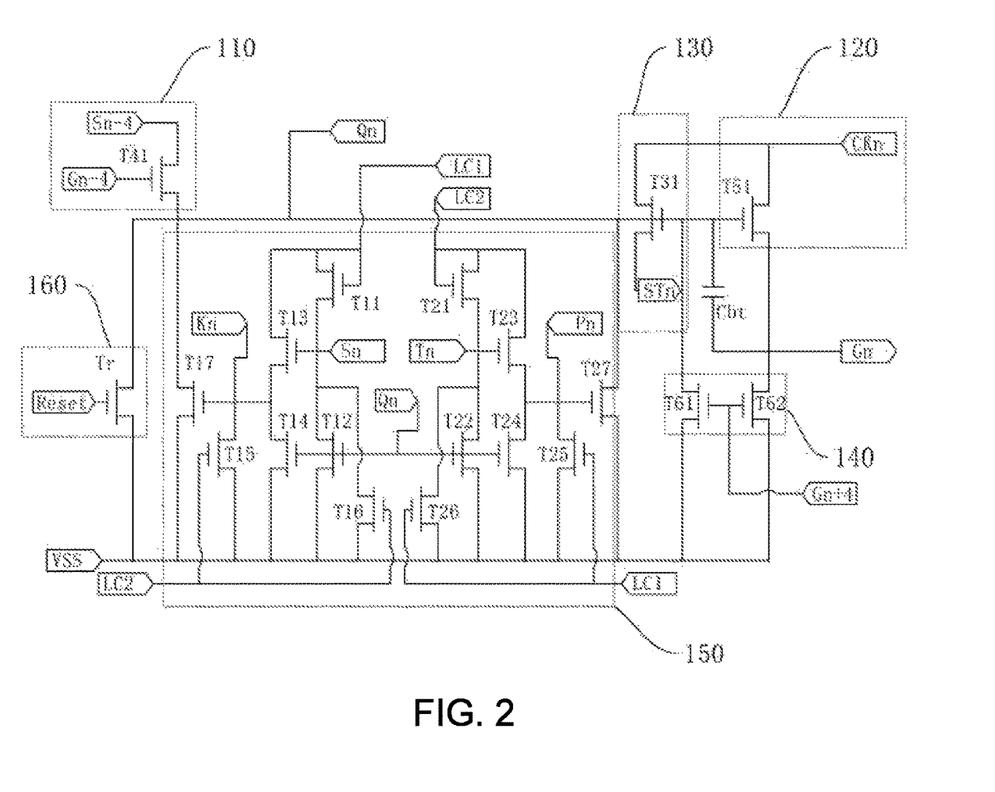
FIG. 2 is a circuit diagram of another GOA unit according to an embodiment of the present invention.

In another embodiment of the present invention, as shown in FIG. 2, a setting method of switching transistors in the pull-up control module 110, the pull-up module 120, and the pull-down module 140 of the nth GOA unit is added. This is only an embodiment provided by the present invention, and is not limited in other ways.

In this embodiment, the pull-up control module 110 includes a forty-first switching transistor T41. A gate of the forty-first switching transistor T41 is connected to the n−4th stage scanning signal Gn−4, and a source of the forty-first switching transistor T41 is connected to the n−4th stage transmitting signal Sn−4. According to the control of the n−4th stage scanning signal Gn−4, the n−4th stage transmission signal Sn−4 is output to the current-stage control signal Qn.

The pull-up module 120 includes a fifty-first switching transistor T51. A gate of the fifty-first switching transistor T51 is connected to the current-stage control signal Qn, and a source of the fifty-first switching transistor T51 is connected to the clock signal CKn. The clock signal CKn is output to the current-stage scanning signal Gn according to the control of the current-stage control signal Qn.

The pull-down module 140 includes a sixty-first switching transistor T61 and a sixty-second switching transistor T62. A gate of the sixty-first switching transistor T61 and a gate of the sixty-second switching transistor T62 are both connected to the n+4th stage scanning signal Gn+4. A source of the sixty-first switching transistor T61 and a source of the sixty-second switching transistor T62 are both connected to the low-potential signal VSS. A drain of the sixty-first switching transistor T61 is connected to the current-stage control signal Qn. A drain of the sixty-second switching transistor T62 is connected to the current-stage scanning signal Gn. According to the control of the n+4th stage scanning signal Gn+4, the current-stage control signal Qn and the current-stage scanning signal Gn are pulled down to a low potential, respectively.

In summary, in an embodiment of the present invention, two new switching transistor devices are added to the first inverter and the second inverter, respectively, so as to release the charge remaining in the first inverter and the second inverter. This effectively reduces current stress on the transistor devices in the inverter, thereby increasing life of the transistor devices and increasing stability of the GOA circuit.

Figure 3:
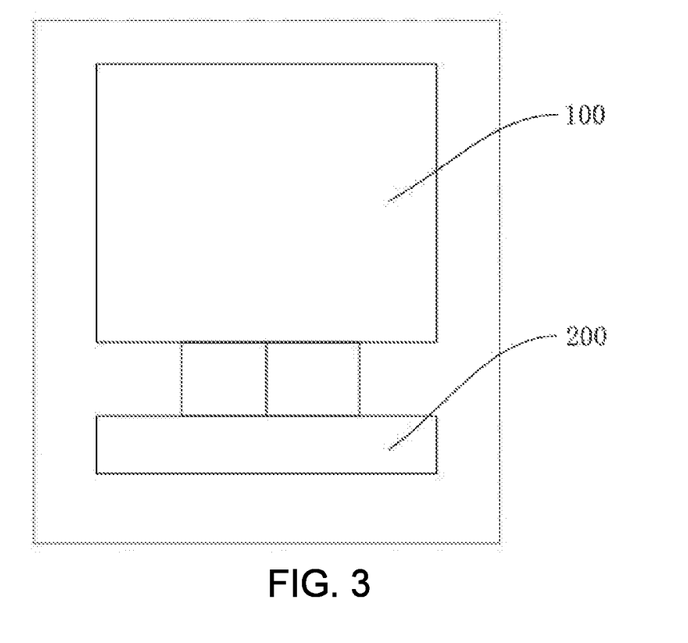
FIG. 3 is a schematic structural diagram of a display panel according to an embodiment of the present invention.

In addition, an embodiment of the present invention also provides a display panel. As shown in FIG. 3, which is a schematic structural diagram of a display panel provided by an embodiment of the present invention.

The display panel includes a display area 100 and a GOA circuit 200 disposed on one side of the display area 100. The structure and principle of the GOA circuit 200 are the same as those of the GOA circuit in the foregoing embodiments, and details are not described herein again.

It should be noted that FIG. 3 is only a schematic structural diagram of a display panel provided by an embodiment of the present invention, but is not limited thereto.

In the above embodiments, the description of each embodiment has its own emphasis. For a part that is not described in detail in one embodiment, reference may be made to related descriptions in other embodiments.

The GOA circuit and the display panel provided by the embodiments of the present invention have been described in detail above. Specific examples are used herein to explain the principle and implementation of the present invention. The description of the above embodiments is only used to help understand the technical solution of the present invention and its core idea. Those of ordinary skill in the art should understand that they can still modify the technical solutions described in the foregoing embodiments, or replace some of the technical features equivalently. These modifications or replacements do not make the essence of the corresponding technical solutions outside the scope of the technical solutions of the embodiments of the present invention.

What is claimed is:

1. A gate driver on array (GOA) circuit, comprising:
a plurality of cascaded GOA units, wherein a nth GOA unit comprises a pull-up control module, a pull-up module, a cascade module, a pull-down module, a pull-down maintenance module, and a bootstrap capacitor, and n is a positive integer;
wherein the pull-down maintenance module is configured to maintain a potential of a current-stage control signal, and the pull-down maintenance module comprises a first inverter;
wherein the first inverter comprises an eleventh switching transistor, a twelfth switching transistor, a thirteenth switching transistor, a fourteenth switching transistor, a fifteenth switching transistor, and a sixteenth switching transistor;
wherein a source and a gate of the eleventh switching transistor and a source of the thirteenth switching transistor are all connected to a first potential signal;
wherein a drain of the eleventh switching transistor, a drain of the twelfth switching transistor, a gate of the thirteenth switching transistor, and a drain of the sixteenth switching transistor are all connected to a first node;
wherein a drain of the thirteenth switching transistor, a drain of the fourteenth switching transistor, and a drain of the fifteenth switching transistor are all connected to a second node;
wherein a gate of the twelfth switching transistor and a gate of the fourteenth switching transistor are both connected to the current-stage control signal;
wherein a source of the twelfth switching transistor, a source of the fourteenth switching transistor, a source of the fifteenth switching transistor, and a source of the sixteenth switching transistor are all connected to a low-potential signal;
wherein a gate of the fifteenth switching transistor and a gate of the sixteenth switching transistor are both connected to a second potential signal; and
wherein a phase of the first potential signal and a phase of the second potential signal are opposite.

2. The GOA circuit according to claim 1, wherein the pull-down maintenance module further comprises a second inverter, and the second inverter comprises a twenty-first switching transistor, a twenty-second switching transistor, a twenty-third switching transistor, a twenty-fourth switching transistor, a twenty-fifth switching transistor, and a twenty-sixth switching transistor;
wherein a source and a gate of the twenty-first switching transistor and a source of the twenty-third switching transistor are all connected to the second potential signal;
wherein a drain of the twenty-first switching transistor, a drain of the twenty-second switching transistor, a gate of the twenty-third switching transistor, and a drain of the twenty-six switching transistor are all connected to a third node;
wherein a drain of the twenty-third switching transistor, a drain of the twenty-fourth switching transistor, and a drain of the twenty-fifth switching transistor are all connected to a fourth node;
wherein a gate of the twenty-second switching transistor and a gate of the twenty-fourth switching transistor are both connected to the current-stage control signal;

wherein a source of the twenty-second switching transistor, a source of the twenty-fourth switching transistor, a source of the twenty-fifth switching transistor, and a source of the twenty-sixth switching transistor are all connected to the low-potential signal; and wherein a gate of the twenty-fifth switching transistor and a gate of the twenty-sixth switching transistor are both connected to the first potential signal.

3. The GOA circuit according to claim 2, wherein the pull-down maintenance module further comprises a seventeenth switching transistor and a twenty-seventh switching transistor;
wherein a gate of the seventeenth switching transistor is connected to the second node;
wherein a source and a drain of the seventeenth switching transistor are connected to the low-potential signal and the current-stage control signal, respectively;
wherein a gate of the twenty-seventh switching transistor is connected to the fourth node; and
wherein a source and a drain of the twenty-seventh switching transistor are connected to the low-potential signal and the current-stage control signal, respectively.

4. The GOA circuit according to claim 1, wherein the GOA unit further comprises a reset module configured to reset a potential of the current-stage control signal;
wherein the reset module comprises a reset switching transistor; and
wherein a gate of the reset switching transistor is connected to a reset signal, a source of the reset switching transistor is connected to the low-potential signal, and a drain of the reset switching transistor is connected to the current-stage control signal.

5. The GOA circuit according to claim 1, wherein the pull-up control module receives an n−4th stage transmission signal and outputs the current-stage control signal according to a control of an n−4th stage scanning signal.

6. The GOA circuit according to claim 5, wherein the pull-up module is electrically connected to the pull-up control module, and the pull-up module receives a clock signal and outputs a current-stage scanning signal according to a control of the current-stage control signal.

7. The GOA circuit according to claim 6, wherein an end of the bootstrap capacitor is connected to the current-stage control signal and another end thereof is connected to the current-stage scanning signal.

8. The GOA circuit according to claim 6, wherein the cascade module comprises a thirty-first switching transistor, a source of the thirty-first switching transistor is connected to the clock signal, a gate of the thirty-first switching transistor is connected to the current-stage control signal, and a drain of the thirty-first switching transistor outputs a current-stage transmission signal.

9. The GOA circuit according to claim 6, wherein the pull-down module receives the low-potential signal and pulls down the current-stage control signal and the current-stage scanning signal to a low potential according to a control of a n+4th stage scanning signal.

10. A display panel, comprising:
a gate driver on array (GOA) circuit comprising a plurality of cascaded GOA units, wherein a nth GOA unit comprises a pull-up control module, a pull-up module, a cascade module, a pull-down module, a pull-down maintenance module, and a bootstrap capacitor, and n is a positive integer;

wherein the pull-down maintenance module is configured to maintain a potential of a current-stage control signal, and the pull-down maintenance module comprises a first inverter;
wherein the first inverter comprises an eleventh switching transistor, a twelfth switching transistor, a thirteenth switching transistor, a fourteenth switching transistor, a fifteenth switching transistor, and a sixteenth switching transistor;
wherein a source and a gate of the eleventh switching transistor and a source of the thirteenth switching transistor are all connected to a first potential signal;
wherein a drain of the eleventh switching transistor, a drain of the twelfth switching transistor, a gate of the thirteenth switching transistor, and a drain of the sixteenth switching transistor are all connected to a first node;
wherein a drain of the thirteenth switching transistor, a drain of the fourteenth switching transistor, and a drain of the fifteenth switching transistor are all connected to a second node;
wherein a gate of the twelfth switching transistor and a gate of the fourteenth switching transistor are both connected to the current-stage control signal;
wherein a source of the twelfth switching transistor, a source of the fourteenth switching transistor, a source of the fifteenth switching transistor, and a source of the sixteenth switching transistor are all connected to a low-potential signal;
wherein a gate of the fifteenth switching transistor and a gate of the sixteenth switching transistor are both connected to a second potential signal; and
wherein a phase of the first potential signal and a phase of the second potential signal are opposite.

11. The display panel according to claim 10, wherein the pull-down maintenance module further comprises a second inverter, and the second inverter comprises a twenty-first switching transistor, a twenty-second switching transistor, a twenty-third switching transistor, a twenty-fourth switching transistor, a twenty-fifth switching transistor, and a twenty-sixth switching transistor;
wherein a source and a gate of the twenty-first switching transistor and a source of the twenty-third switching transistor are all connected to the second potential signal;
wherein a drain of the twenty-first switching transistor, a drain of the twenty-second switching transistor, a gate of the twenty-third switching transistor, and a drain of the twenty-six switching transistor are all connected to a third node;
wherein a drain of the twenty-third switching transistor, a drain of the twenty-fourth switching transistor, and a drain of the twenty-fifth switching transistor are all connected to a fourth node;
wherein a gate of the twenty-second switching transistor and a gate of the twenty-fourth switching transistor are both connected to the current-stage control signal;
wherein a source of the twenty-second switching transistor, a source of the twenty-fourth switching transistor, a source of the twenty-fifth switching transistor, and a source of the twenty-sixth switching transistor are all connected to the low-potential signal; and
wherein a gate of the twenty-fifth switching transistor and a gate of the twenty-sixth switching transistor are both connected to the first potential signal.

12. The display panel according to claim 11, wherein the pull-down maintenance module further comprises a seventeenth switching transistor and a twenty-seventh switching transistor;

wherein a gate of the seventeenth switching transistor is connected to the second node;

wherein a source and a drain of the seventeenth switching transistor are connected to the low-potential signal and the current-stage control signal, respectively;

wherein a gate of the twenty-seventh switching transistor is connected to the fourth node; and wherein a source and a drain of the twenty-seventh switching transistor are connected to the low-potential signal and the current-stage control signal, respectively.

13. The display panel according to claim 10, wherein the GOA unit further comprises a reset module configured to reset a potential of the current-stage control signal, the reset module comprises a reset switching transistor, a gate of the reset switching transistor is connected to a reset signal, a source of the reset switching transistor is connected to the low-potential signal, and a drain of the reset switching transistor is connected to the current-stage control signal.

14. The display panel according to claim 10, wherein the pull-up control module receives an n−4th stage transmission signal and outputs the current-stage control signal according to a control of an n−4th stage scanning signal.

15. The display panel according to claim 14, wherein the pull-up module is electrically connected to the pull-up control module, and the pull-up module receives a clock signal and outputs a current-stage scanning signal according to a control of the current-stage control signal.

16. The display panel according to claim 15, wherein an end of the bootstrap capacitor is connected to the current-stage control signal and another end thereof is connected to the current-stage scanning signal.

17. The display panel according to claim 15, wherein the cascade module comprises a thirty-first switching transistor, a source of the thirty-first switching transistor is connected to the clock signal, a gate of the thirty-first switching transistor is connected to the current-stage control signal, and a drain of the thirty-first switching transistor outputs a current-stage transmission signal.

18. The display panel according to claim 15, wherein the pull-down module receives the low-potential signal and pulls down the current-stage control signal and the current-stage scanning signal to a low potential according to a control of a n+4th stage scanning signal.

* * * * *